United States Patent [19]
Iwamuro

[11] Patent Number: 5,936,267
[45] Date of Patent: Aug. 10, 1999

[54] INSULATED GATE THYRISTOR

[75] Inventor: Noriyuki Iwamuro, Nagano, Japan

[73] Assignee: Fuji Electric Co., Ltd., Kawasaki, Japan

[21] Appl. No.: 08/823,750

[22] Filed: Mar. 25, 1997

[30] Foreign Application Priority Data

Mar. 25, 1996 [JP] Japan .................................. 8-067545

[51] Int. Cl.$^6$ .......................... H01L 29/74; H01L 31/111
[52] U.S. Cl. .......................... 257/147; 257/152; 257/153
[58] Field of Search .................... 257/139, 144, 257/147, 152, 153, 341, 401

[56] References Cited

U.S. PATENT DOCUMENTS

| | | | |
|---|---|---|---|
| 4,502,070 | 2/1985 | Leipold et al. ........................ | 257/147 |
| 4,847,671 | 7/1989 | Pattanayak et al. .................... | 257/139 |
| 5,164,802 | 11/1992 | Jones et al. ............................. | 257/341 |
| 5,317,171 | 5/1994 | Shekar et al. ........................... | 257/138 |
| 5,319,222 | 6/1994 | Shekar et al. ........................... | 257/139 |
| 5,381,026 | 1/1995 | Shirohe et al. ......................... | 257/147 |

FOREIGN PATENT DOCUMENTS 0 736 909 A2  10/1996  European Pat. Off. ...... H01L 29/745

OTHER PUBLICATIONS

V.A.K. Temple, "MOS Controlled Thyristors (MCT's)," *IEDM*, pp. 282–285 (1984).

M.S. Shekar et al., "High–Voltage Current Saturation in Emitter Switched Thyristors," *IEEE Electron Device Letters*, vol. 12, No. 7, pp. 387–389 (1991).

N. Iwamuro et al., "A Study of EST's Short–Circuit SOA," *IEEE*, pp. 71–76 (1993).

N. Iwamuro et al., "Comparison of RBSOA of ESTs With IGBTs and MCTs," *IEEE*, pp. 195–200 (1994).

*Primary Examiner*—Wael Fahmy
*Attorney, Agent, or Firm*—Finnegan, Henderson, Farabow, Garrett & Dunner, L.L.P.

[57] ABSTRACT

Surfaces of a second p base region 6 and an n emitter region 8 are covered with an insulating film 19 and the second p base region 6 and a first p base region 4 are connected partially below a gate electrode 10. In a conventional EST, a potential difference is obtained by hole current flowing in a Z direction to make the transition from an IGBT mode to a thyristor mode. However, since an n emitter region 8 becomes a potential almost equal to that of an n source region 7, hole current injected from a p emitter layer 1 causes the potential of the second p base region 6 to rise, making the prompt transition to the thyristor mode. Particularly, in the portion where the second p base region 6 and the first p base region 4 are in contact with each other, an inversion layer at the gate on time is short and small in resistance and does not touch an n base layer 3, thus electrons from the n source region 7 flow effectively into the n emitter region 8 and the on-state voltage is lowered. At the turn-off time, a pn junction below the n emitter region 8 is uniformly covered, the destruction resistance amount is enhanced, and the turn-off time is shortened.

10 Claims, 13 Drawing Sheets

10 11 14 19

7 5 4 6 8

INSULATED GATE THYRISTOR

BACKGROUND OF THE INVENTION

1. Field of the Invention

This invention relates to an insulated gate thyristor used as a power switching device.

2. Description of the Related Art

Thyristors have been used as devices indispensable for large-capacity applications because of the low on-state voltage characteristic of the thyristors. Nowadays, gate turn-off (GTO) thyristors are often used as high-voltage and large-current area devices. However, it is becoming obvious that the GTO thyristor has disadvantages in (1) that it requires a large gate current to turn off, namely, provide a small turn-off gain and (2) that it requires a large snubber circuit to safely turn off. Since the GTO thyristor does not show a current saturation characteristic in its current and voltage characteristics, passive parts such as a fuse must be connected for load short-circuiting protection, leading to a large bottleneck in system miniaturization and cost reduction. The MOS controlled thyristor (MCT) of a voltage-driven thyristor published on IEEE IEDM Tech. Dig. 1984. p.282 by V. A. K. Temple has been analyzed in characteristics and improved in various laboratories and institutes in the world since then, because the MCT, which is voltage-driven, needs an exceptionally easy gate circuit and shows a low on-state voltage characteristic as compared with the GTO thyristor. However, like the GTO thyristor, the MCT does not show a current saturation characteristic, thus requires passive parts such as a fuse in practical use.

Doctor Pattanayak et al disclosed in U.S. Pat. No. 4,847,671 (Jul. 11, 1989) that an emitter switched thyristor (EST) shows a current saturation characteristic. M. S. Shekar et al. showed on IEEE Electron Device Lett. vol.12 (1991) p.387 that a dual channel emitter switched thyristor (EST) shows a current saturation characteristic up to a high-voltage area by actual measurement. Further, the inventor et al. disclosed the analysis results of FBSOA (forward bias safe operation area) and RBSOA (reverse bias safe operation area) of the EST on Proc. IEEE ISPSD '93, p.71 and Proc. IEEE ISPSD '94, p.195, and first opened the way for device development having a safe operation area at the load short-circuiting time in the voltage-driven thyristors. FIG. 11 shows the device structure of the EST.

As seen in the figure, the device comprises a first p base region 4, a p$^+$ well region 5 of a deep diffusion depth occupying a part of the first p base region 4, and a second p base region 6 formed on the surface layer of an n base layer 3 located via an n buffer layer 2 on a p emitter layer 1, an n source region 7 formed on the surface layer of the first p base region 4, and an n emitter region 8 formed on the surface layer of the second p base region 6. A gate electrode 10 is disposed via a gate oxide film 9 extending from the portion of the first p base region 4 sandwiched between the n source region 7 and the exposure part of the n base layer 3 to the portion of the second p base region 6 sandwiched between the n emitter region 8 and the exposure part of the n base layer 3. However, the length of every region in the Z direction is limited and the first p base region 4 and the second p base region 6 are connected on the outside and the p$^+$ well region 5 is formed like an L letter on the outside. A cathode electrode 11 coming in contact with the surface of the p$^+$ well region 5 is also in contact with the surface of the n source region 7. On the other hand, an anode electrode 12 is disposed on the full rear face of the p emitter layer 1.

If a positive voltage is applied to the gate electrode 10 with the cathode electrode 11 grounded and a positive voltage applied to the anode electrode 12, an inversion layer (partial accumulation layer) is formed below the gate oxide film 9 and lateral MOSFET is turned on, whereby first electrons pass from the cathode electrode 11 via the n source region 7 through the inversion layer (channel) of the surface layer of the first p base region 4 and are supplied to the n base layer 3. The electrodes serve as base current of a pnp transistor consisting of the p emitter layer 1, the n buffer layer 2 and n base layer 3, and the first and second p base regions 4 and 6 and the p$^+$ well region 5, whereby the pnp transistor operates. Then, holes are injected from the p emitter layer 1 and flow through the n buffer layer 2 and n base layer 3 into the first p base region 4; some of the holes flow into the second p base region 6. The holes flow in the Z direction below the n emitter region 8 into the cathode electrode 11 (IGBT mode). When the current furthermore increases, the pn junction between the n emitter region 8 and the second p base region 6 is forward-biased and a thyristor section consisting of the p emitter layer 1, the n buffer layer 2 and n base layer 3, the second p base region 6, and the n emitter region 8 is latched up. (This operation is called thyristor mode.) To turn off the EST, the potential of the gate electrode 10 is lowered to the threshold value of the lateral MOSFET or less and the MOSFET is turned off, whereby the n emitter 8 is potentially isolated from the cathode electrode 11 and the thyristor operation is stopped.

FIGS. 12 and 13 are sectional views of improved ESTs described in U.S. Pat. Nos. 5,317,171 (May 31, 1994) and 5,319,222 (Jun. 7, 1994) according to the invention of M. S. Shekar et. al. Particularly, the improved EST in FIG. 13 is intended for lower on-state voltage unlike the EST shown in FIG. 11.

FIG. 14 is a sectional view of an FET control thyristor described in U.S. Pat. No. 4,502,070 (Feb. 26, 1985) according to the invention of Leipold et. al, characterized in that no electrode is in contact with the top of a second p base region 6.

As seen from the description made so far, the EST shown in FIG. 11 uses holes flowing through the second p base region 6 in the Z direction to forward-bias the pn junction between the second p base region 6 and the n emitter region 8, thus the degree of the forward bias lessens as approaching the contact portion between the cathode electrode 11 and the second p base region 6. This means that the injection amount of electrodes from the n emitter region 8 is not uniform along the Z direction in the pn junction. If the EST is turned on from such an on state, the junction near the contact portion with the cathode electrode 11 shallowly forward-biased is first recovered and the portions distant from the contact portion with the cathode electrode 11 is not readily recovered. Thus, current concentration at the off time is easily incurred and the destruction resistance amount at the turn-off time lessens.

The device in FIG. 12 does not differ from the EST in FIG. 11 in operation principle; a cathode electrode 11 extends in the Y direction and comes in direct contact with the surface of a second p base region 6, thus the turn-off speed can be made fast, and since hole current in the Z direction is not used, uniform on operation is enabled. However, if a pn junction between an n emitter region 8 and the second p base region 6 is turned on at the thyristor operation time, then uneven injection of minority carriers occurs in the horizontal direction (Y direction) and lowering the on-state voltage as expected does not occur. To solve this problem, for example, if the impurity concentration of the second p base region 6 is lowered and resistance thereof is raised, a depletion layer is punched through in the n emitter region 8 at the forward withstand voltage time and sufficient withstand voltage is not produced.

The device shown in FIG. 13 has a structure wherein an n emitter 8 extends off a second p base region 6 to furthermore lower on-state voltage; it has a disadvantage in that the structure does not produce forward withstand voltage.

With the device shown in FIG. 14, an n emitter region 8 and a second p base region 6 are completely separated from a cathode electrode 11, thereby preventing uneven thyristor operation from occurring. However, since some of electrons supplied from an n source region 7 in the thyristor mode are not directed toward an n emitter region 8 and flow into an n base layer 3, the device has a disadvantage in that the onstate voltage of the thyristor becomes high.

SUMMARY OF THE INVENTION

It is therefore an object of the invention to provide an insulated gate thyristor of a structure capable of uniformly recovering a pn junction at the turn-off time having a large turn-off resistance amount, a small on-state voltage, and a good withstand voltage characteristic.

To the end, according to the invention, there is provided an insulated gate thyristor comprising a first conduction type base layer of high resistivity, first and second second conduction type base regions selectively formed on a surface layer of one face side of the first conduction type base layer, a first conduction type source region selectively formed on a surface layer of the first second conduction type base region, a first conduction type emitter region selectively formed on a surface layer of the second second conduction type base region, a gate electrode formed via an insulating film on a surface of the first second conduction type base region sandwiched between the first conduction type source region and emitter region, an exposure portion of the first conduction type base layer, and a surface of the second second conduction type base region, a first main electrode coming in contact with an exposure portion of the first second conduction type base region and the first conduction type source region in common, a second conduction type emitter layer formed on an opposite face side of the first conduction type base layer, and a second main electrode coming in contact with the second conduction type emitter layer, characterized in that a full surface of the second second conduction type base region is covered with an insulating film and that the first second conduction type base region and the second second conduction type base region are connected partially below the gate electrode.

In doing so, when a voltage is applied to the insulation gate and an inversion layer is generated just below the gate electrode, the first conduction type emitter region becomes the same potential as the first main electrode via the MOSFET channel region and the thyristor consisting of the first conduction type emitter region, the second second conduction type base region, the first conduction type base layer, and the second conduction type emitter layer is turned on. At this time, uniform electron injection occurs from the whole first conduction type emitter region, thus the prompt transition to the thyristor mode is made and the on-state voltage is lowered. Unlike the conventional EST, hole current flowing through the second second conduction type base region in the Z direction is not required. In contrast, at the turn-off time, the pn junction is uniformly recovered and no current concentration occurs, increasing the destruction resistance amount. Moreover, in the connection portion of the first and second second conduction type base regions, the inversion layer is short and is not connected to the first conduction type base layer.

The second second conduction type base region may be formed almost like a stripe, or at least one of the first and second second conduction type base regions, the first conduction type emitter region, and the first conduction type source region may be polygonal, circular, or elliptic.

In doing so, the use efficiency of the semiconductor substrate is enhanced, a current distribution is made even, and thermal balance also becomes good.

The first second conduction type base region and the first conduction type source region of a surface layer of the base region may be formed so as to surround the second second conduction type base region, or a plurality of the first second conduction type base regions may be formed.

In doing so, current flowing from the first conduction type emitter region through the channel region into the first conduction type source region is spread and does not concentrate.

A plurality of the first second conduction type base regions and the first conduction type source regions of surface layers of the base regions may be formed in the surroundings of the second second conduction type base region, an almost annular gate electrode may be disposed so as to surround the insulating film on the surface of the second second conduction type base region, and the first main electrode may be disposed via an insulating film on an opposite side with the gate electrode between.

In doing so, an accumulation layer is formed on the surface layer of the first conduction type semiconductor layer below the gate electrode and the on-state voltage is lowered.

It is also important that the first conduction type base layer exists between two first second conduction type base regions and that the gate electrode is disposed via a gate insulating film on their surfaces.

In doing so, carrier injection from the first second conduction type base region into the first conduction type base layer is executed at many points and conductance also increases in the low current range.

The contact portion between the first main electrode and the first second conduction type base region and the first conduction type source region may be shaped like a polygon, a circle, or an ellipse.

In doing so, the use efficiency of the semiconductor substrate is enhanced, a current distribution is made even, and thermal balance also becomes good.

The above and other objects and features of the present invention will be more apparent from the following description taken in conjunction with the accompanying drawings.

DETAILED DESCRIPTION OF THE PREFERRED EMBODIMENTS

To solve the above-mentioned problems, various insulated gate thyristors as developments of ESTs have been prototyped. In the process, the inventor et al. have found that the first main electrode need not be brought into the second second conduction type base region and that even a device having the surface of the second second conduction type base region covered with an insulating film and a portion where the first and second second conduction type base regions touch below the gate electrode makes the transition to the thyristor mode and shows a good trade-off characteristic between the on-state voltage and turn-off time. Further, they have also examined plane patterns.

Based on the result, the inventor et al. have found that the first and second second conduction type base regions may be placed facing each other like stripes or may be made polygonal, circular, or elliptic, that particularly if the first second conduction type base region is placed so as to surround the second second conduction type base area, current concentration is suppressed and the trade-off characteristic is improved, that a plurality of first second conduction type base regions may be placed in the surroundings of the second second conduction type base region, etc.

The on-state voltage can also be decreased by changing the diffusion depth of the first, second second conduction type base region or the diffusion depths of the first conduction type source region and the first conduction type emitter region. Localization of life time killers is also effective.

Figure 11:
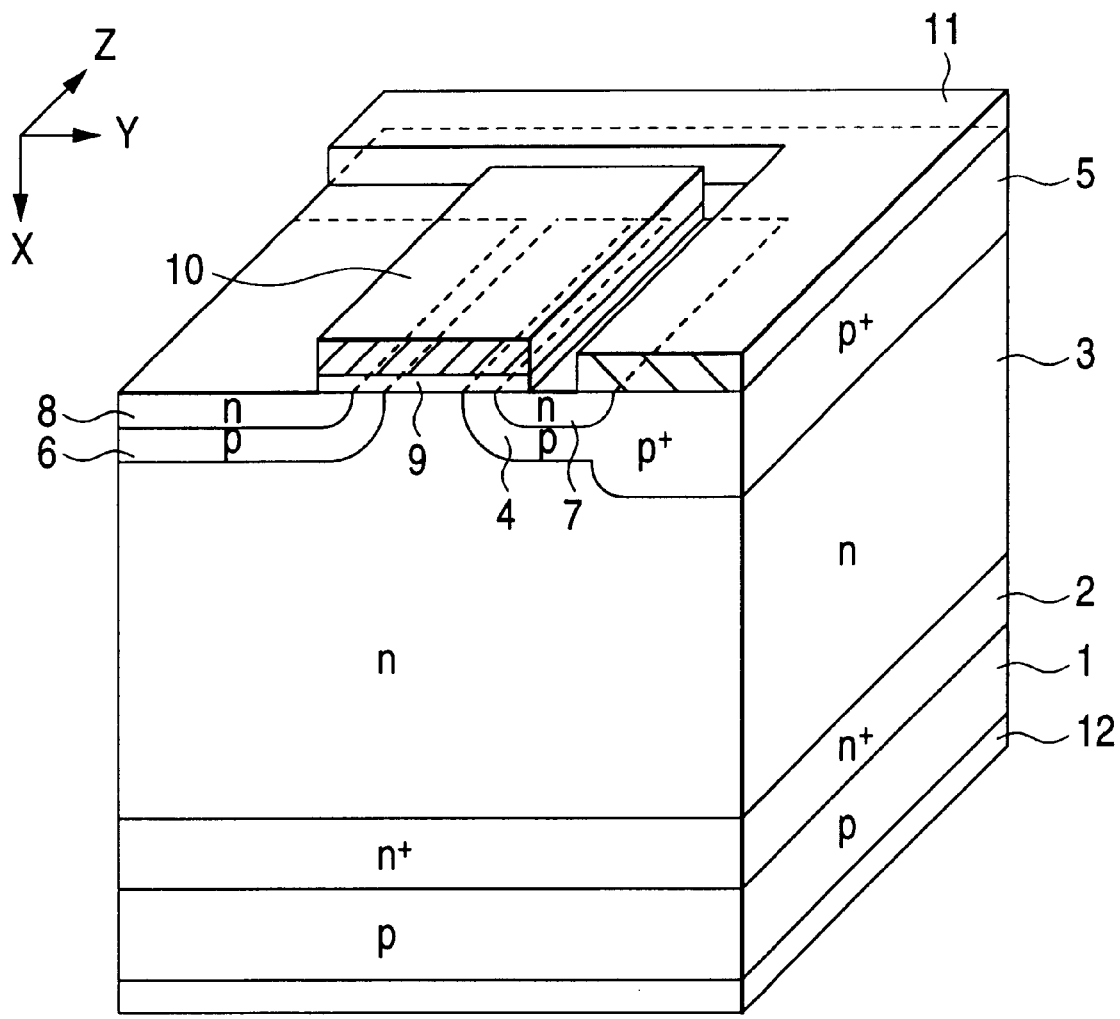
FIG. 11 is a broken perspective view of an EST.

Referring now to the accompanying drawings, there are shown preferred embodiments of the invention. Parts identical with or similar to those previously described with reference to FIG. 11 are denoted by the same reference numerals in the accompanying drawings. In the embodiments, regions and layers to which n is prefixed mean those with electrons as majority carriers, regions and layers to which p is prefixed mean those with holes as majority carriers, and the first and second conduction types are n and p respectively, but can also be p and n respectively.

Now, a description will be given in more detail of preferred embodiments of the present invention with reference to the accompanying drawings.

Embodiment 1

Figure 2A:
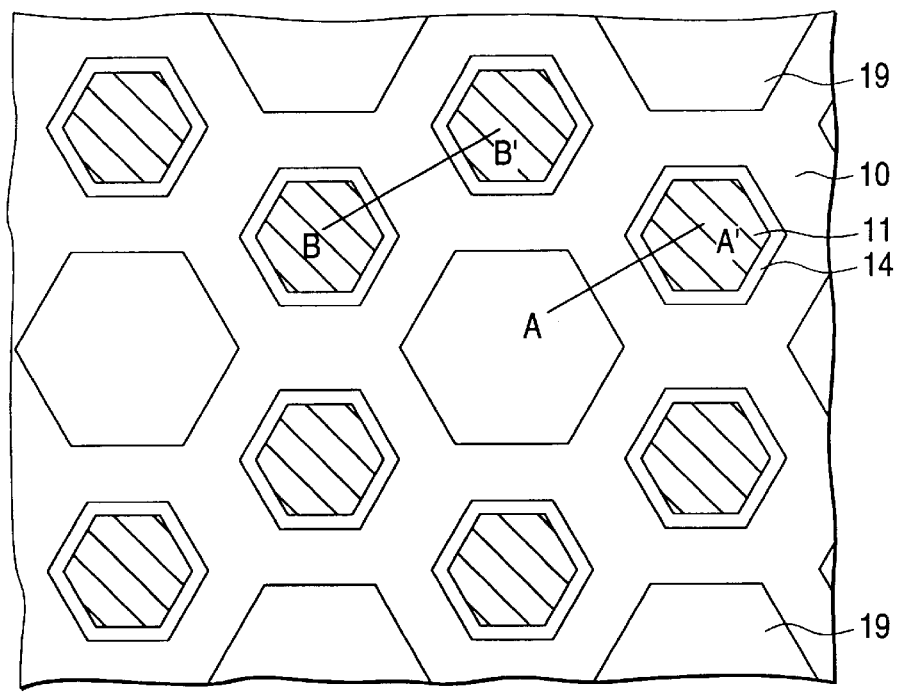
FIG. 2A is a horizontal sectional view at the center of a gate electrode of the insulated gate thyristor of the first embodiment of the invention.
Figure 15:
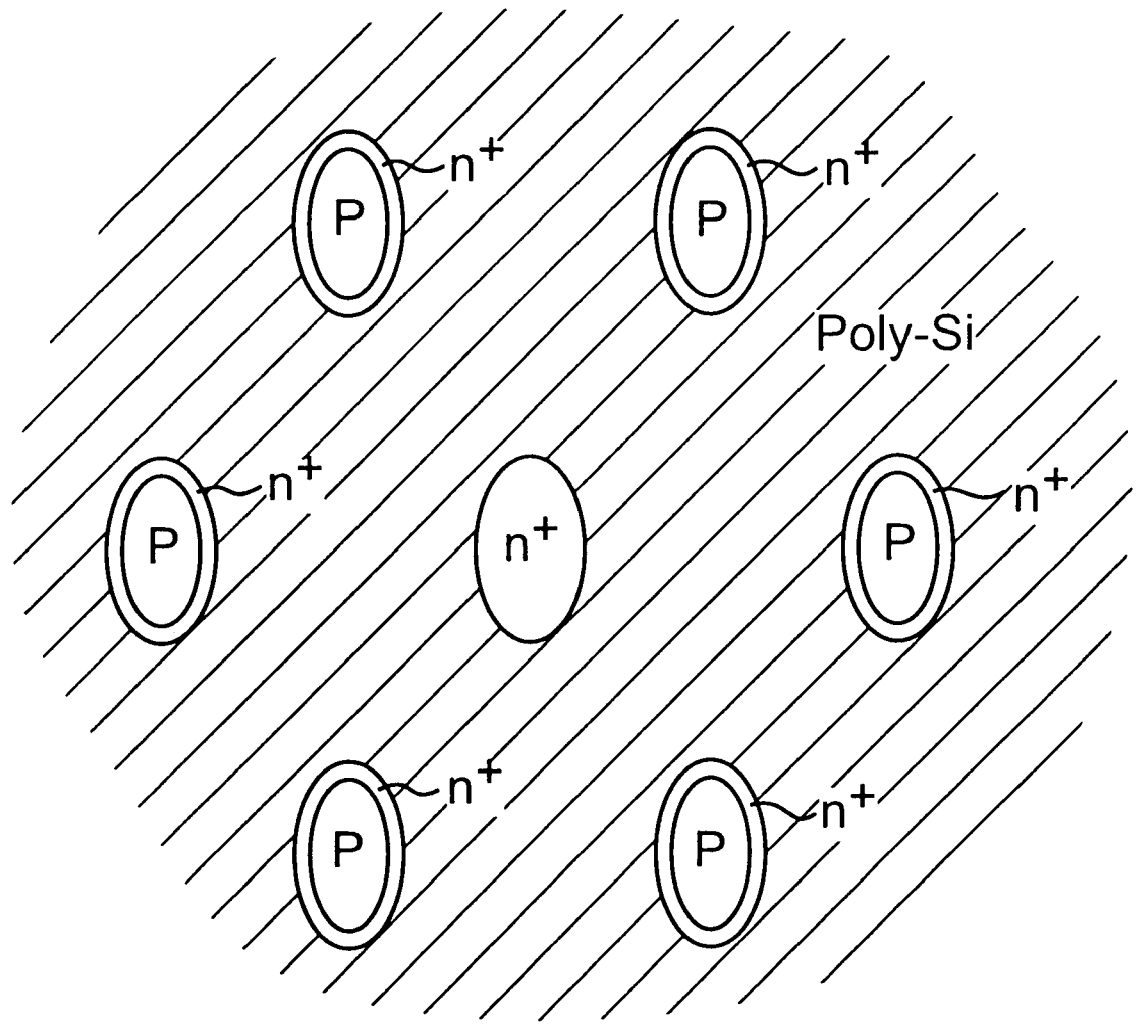
FIG. 15 is a horizontal sectional view at the center of a gate electrode of an insulated gate thyristor of an additional embodiment of the invention.
Figure 16A:
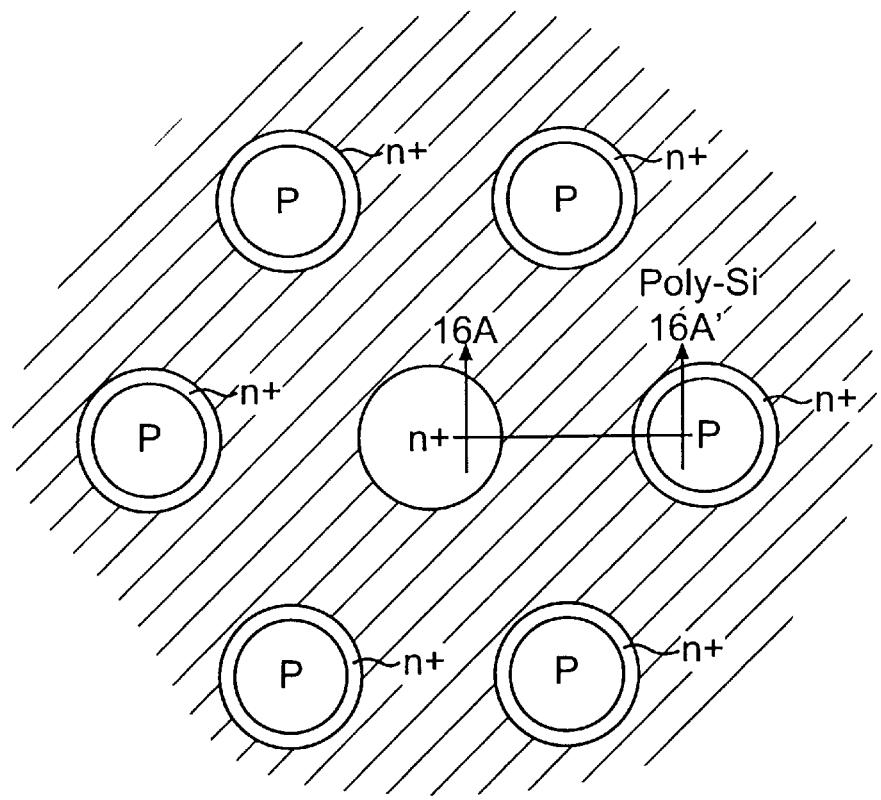
FIG. 16 is a horizontal sectional view at the center of a gate electrode of an insulated gate thyristor of an additional embodiment of the invention.
Figure 16B:
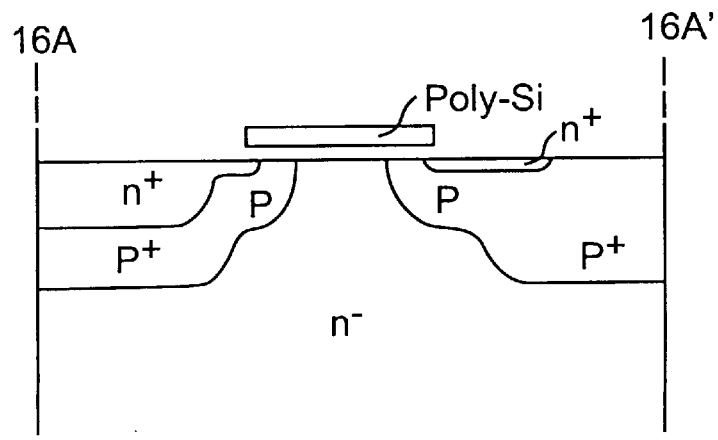

FIG. 2A is a horizontal sectional view at the center of a gate electrode of an insulated gate thyristor of a first embodiment of the invention. A pattern where a net-like gate electrode 10 contains hexagonal insulating films 19 and hexagonal cathodes 11 each surrounded by an insulating film 14 are placed surrounding the insulating film 19 is repeated. However, the cathode electrode 11 is hexagonal in cross section in the figure; in fact, it often extends to the top of the gate electrode 10 via the insulating film 14 as seen in a sectional view given later. FIGS. 15 and 16 are horizontal sectional views at the center of a gate electrode of an insulated gate thyristor of additional embodiments of the invention. In particular, FIG. 15 shows that the insulating film and cathodes of FIG. 2 may have an elliptical shape, while FIG. 16 shows that the insulating film and cathodes of FIG. 2 may have a circular shape.

Figure 2B:
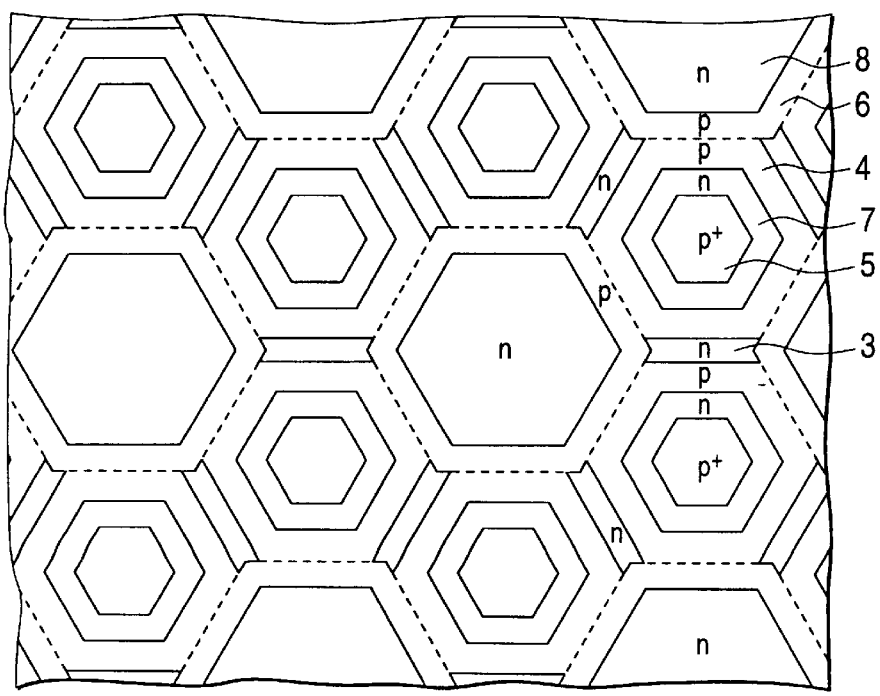
FIG. 2B is a plan view on the silicon substrate surface of the insulated gate thyristor of the first embodiment of the invention.

FIG. 2B is a plan view to show diffusion regions on the surface resulting from removing the insulating films and electrodes on a silicon substrate of the insulated gate thyristor in FIG. 2A. An n emitter region 8 exists in the portion below the hexagonal insulating film 19 in FIG. 2A and is surrounded by a second p base region 6. A hexagonal annular n source region 7 and a p$^+$ well region 5 inside the n source region 7 exist in the portion below the cathode electrode and are surrounded by a first p base region 4. The first p base region 4 and the second p base region 6 touch and the boundary therebetween is denoted by a dotted line. An n base layer 3 is exposed between the two first p base regions 4. The portion below the gate electrode 10 in FIG. 2A is the surface exposure portions of the first p base regions 4, the second p base regions 6, and the n base layers 3.

Figure 1A:
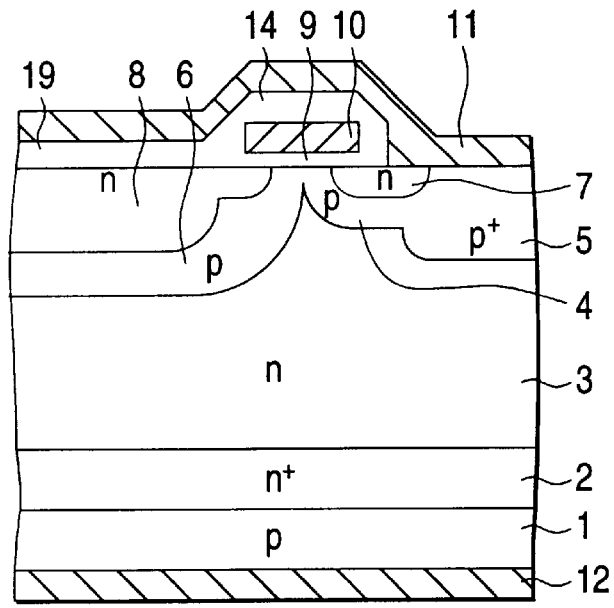
FIGS. 1A and 1B are partially sectional views of an insulated gate thyristor of a first embodiment of the invention.
Figure 1B:
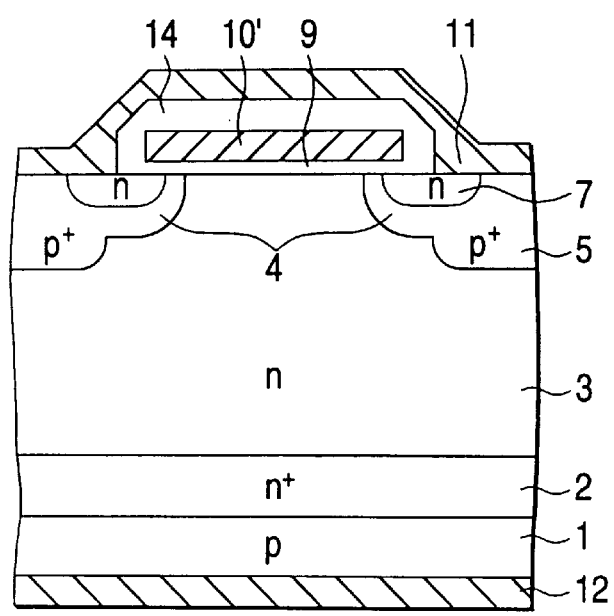

FIGS. 1A and 1B are sectional views taken on line A–A' connecting the insulating film 19 and the cathode electrode 11 and line B–B' connecting the cathode electrodes 11 in FIGS. 2A and 2B. Parts identical with those previously described with reference to FIGS. 2A and 2B are denoted by the same reference numerals in FIGS. 1A and 1B.

Figure 14:
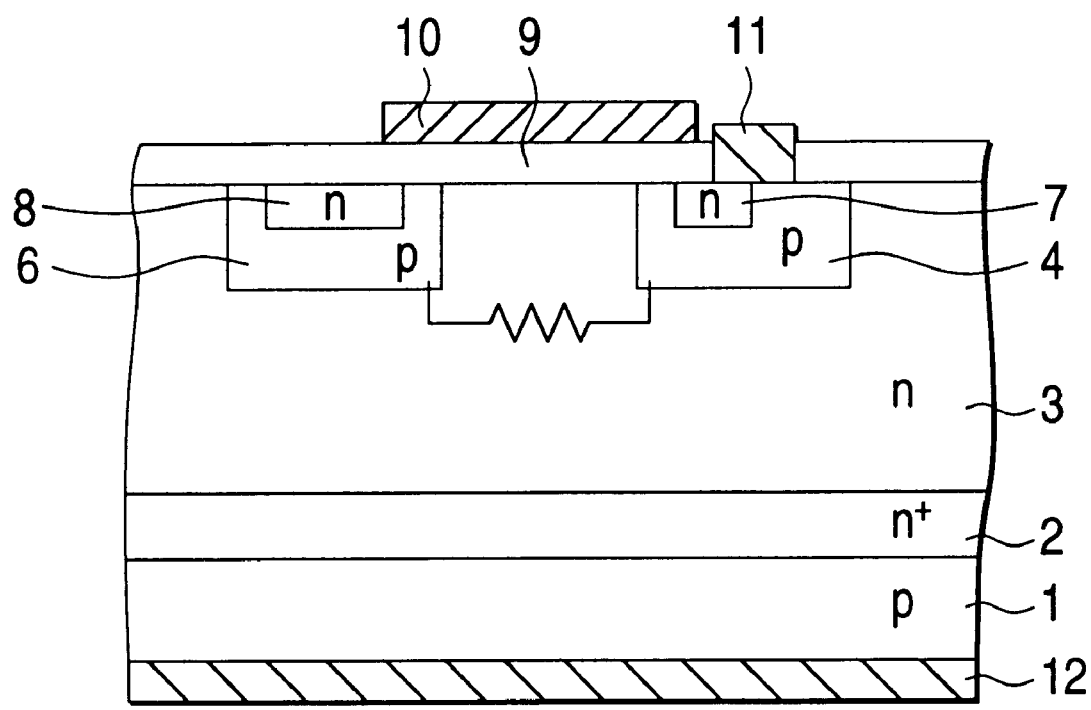
FIG. 14 is a sectional view of an FET control thyristor.

The structure of the semiconductor substrate portion of the insulated gate thyristor shown in FIG. 1A bears a strong resemblance to the FET control thyristor shown in FIG. 14. That is, the first p base region 4 and the second p base region 6 are formed on the surface layer of one face of the high-resistivity n-type base layer 3, the first and second p base regions being in contact with each other in the shallow portion of the surface layer. The p$^+$ well region 5 of a diffusion depth deeper than the first p base region 4 is formed in a part of the first p base region 4 in order to prevent latch-up of a parasitic thyristor. A p emitter layer 1 is formed via an n$^+$ buffer layer 2 on the other face of the n-type base layer 3. The n source region 7 is selectively formed on the surface layer of the first p base region 4 and the n emitter region 8 is selectively formed on the surface layer of the second p base region 6. As in FIG. 14, the gate electrode 10 is disposed via a gate oxide film 9 on the surface of the first and second p base regions 4 and 6 sandwiched between the n source region 7 and the n emitter region 8, forming an n-channel lateral MOSFET. The surface of this side is covered with the insulating film 14 made of phosphorus glass (PSG) etc., and a contact hole is made so that the cathode electrode 11 comes in contact with the surfaces of the first p base region 4 and the n source region 7 in common. The surface of the n emitter region 8 is covered with the insulating film 19. An anode electrode 12 is disposed on the surface of the p emitter layer 1.

FIG. 1B is a sectional view taken on the line connecting the first p base regions 4. In the sectional view, the two first p base regions 4 are formed apart from each other. The $p^+$ well region 5 of a diffusion depth deeper than the first p base region 4 is formed in a part of the first p base region 4 and n source region 7 is selectively formed on the surface layer, as in FIG. 1A. A gate electrode 10' is disposed via the gate oxide film on the surfaces of the first p base region 4 and the n base layer exposure part 3 sandwiched between the n source regions 7, forming an n-channel lateral MOSFET.

The insulated gate thyristor in FIGS. 1A and 1B can be manufactured in almost the same process as a conventional IGBT simply by changing a diffusion region formation mask. That is, for example, a wafer of epitaxial growth of an n layer 10 $\mu$m thick with resistivity 0.1 $\Omega \cdot$cm as the $n^+$ buffer layer 2 and an n layer 55 $\mu$m thick with resistivity 40 $\Omega \cdot$cm as the n base layer 3 on a p-type silicon substrate 450 $\mu$m thick with resistivity 0.02 $\Omega \cdot$cm is used as a device for 600 V. The first and second p base regions 4 and 6 and the p emitter layer 1 are formed by ion implantation and thermal diffusion of boron ions and the n emitter region 8 and the n source region 7 are formed by ion implantation and thermal diffusion of boron and phosphorus ions. Ends of the first p base region 4, the second p base region 6, the n source region 7, and the n emitter region are positioned by the gate electrode 10, 10', etc., made of polysilicon on the semiconductor substrate and are spaced by their respective lateral diffusion. The cathode electrode 11 is formed by sputtering an Al alloy and the anode electrode 12, which is soldered to a metal substrate, is formed by sputtering and depositing three layers of Ti, Ni, and Au. Irradiation with helium ions is executed for life time control of carriers to shorten the switching time. It is a method capable of localizing crystal defects resulting in life time killers. It is executed under the conditions of acceleration voltage 10 MeV and dose amount $1 \times 10^{11}$ to $1 \times 10^{12}$ cm$^{-2}$. After irradiation with helium ions, annealing is performed at 350–375° C.

For example, the dimensions of the parts are as follows: The diffusion depth of the first p base region 4 is 3 $\mu$m, that of the second p base region 6 is 18 $\mu$m, that of the n emitter region 8 is 10 $\mu$m, and that of the n source region 7 is 0.4 $\mu$m, whereby the current amplification factor of the npn transistor of the thyristor section increases and the on-state voltage lessens. The narrow gate electrode 10 is 15 $\mu$m wide, the wide gate electrode 10' is 30 $\mu$m, the n source region 7 is 4 $\mu$m, and the cell pitch is 55 $\mu$m. However, the portion of the n emitter region 8 near the first p base region 4 has almost the same dimension as the n source region 7 to consider withstand voltage.

The operation of the insulated gate thyristor thus formed will be discussed. If a positive voltage of one value (threshold value) or more is applied to the gate electrode 10, 10' with the cathode electrode 11 grounded and a positive voltage applied to the anode electrode 12, an inversion layer (partial accumulation layer) is formed below the gate oxide film 9 and the lateral MOSFET is turned on, whereby first electrons pass through the channel path of cathode electrode 11 → n source region 7 → MOSFET and are supplied to the n base layer 3. The electrodes serve as base current of the pnp transistor (p emitter layer 1/$n^+$ buffer layer 2 and n base layer 3/p base region 4 ($p^+$ well region 5)), whereby the pnp transistor operates. (This operation is called IGBT mode.) Holes are injected from the p emitter layer 1 and flow through the $n^+$ buffer layer 2 and n base layer 3 into the first p base region 4. At the time, the second p base region 6 is floating, thus the potential gradually rises because of the hole current flowing through the n base layer. As seen in the sectional view of FIG. 1A, at the on time, the n emitter region 8 is held at a potential almost equal to that of the n source region 7 through the MOSFET channel region. Thus, injection of electrons from the n emitter region 8 occurs after a while and the thyristor section consisting of the p emitter layer 1, the $n^+$ buffer layer 2 and n base layer 3, the second p base region 6, and the n emitter region 8 operates. (This operation is called thyristor mode.)

At the turn-off time, the potential of the gate electrode 10, 10' is lowered to the threshold value of the lateral MOSFET or less and the lateral MOSFET is turned off, whereby the n emitter 8 is electrically isolated from the cathode electrode 11 and the operation of the thyristor section is stopped.

The insulated gate thyristor in FIGS. 1A and 1B differs from the EST in FIG. 11 in that the surfaces of the second p base region 6 and the n emitter region 8 are covered with the insulating film 14, that the second p base region 6 does not touch the cathode electrode 11, and that the first p base region 4 and the second p base region 6 touch.

Thus, at the on time, the n emitter region 8 is held at almost the same potential as the cathode electrode 11 through the channel region just below the gate electrode 10. Then, the hole current flowing through the n base layer 3 causes the potential of the second p base region 6 to gradually rise and at last injection of electrons from the n emitter region 8 occurs, turning on the thyristor consisting of the n emitter region 8, the second p base region 6, the n base layer 3, and the p emitter layer 1. Therefore, the hole current flowing in the Z direction in the second p base region as with the conventional EST shown in FIG. 11 is not required, and the immediate transition can be made from the IGBT mode to the thyristor mode. Since uniform electron injection occurs from the whole n emitter region 8, the on-state voltage lowers. Moreover, the portion where the first p base region 4 and the second p base region 6 are brought into contact with each other is provided for shortening the channel at the on time in the thyristor mode. Since the channel below the gate electrode 10 does not touch the n base layer 3, the electrons supplied from the n source region 7 are directed toward the n emitter region 8 although some of electrons flow into the n base layer 3 in the FET control thyristor in FIG. 14. Therefore, the on-state voltage in the thyristor mode lowers.

In contrast, at the turn-off time, recovery of the pn junction between the n emitter region 8 and the second p base region 6 is performed uniformly due to the potential difference; current concentration does not occur and RBSOA becomes exceptionally large. Since the depletion layer from the second p base region 6 quickly extends at the turn-off time, a good withstand voltage characteristic is produced and carrier sweeping is also accelerated, so that an excellent switching characteristic is also provided.

Figure 3:
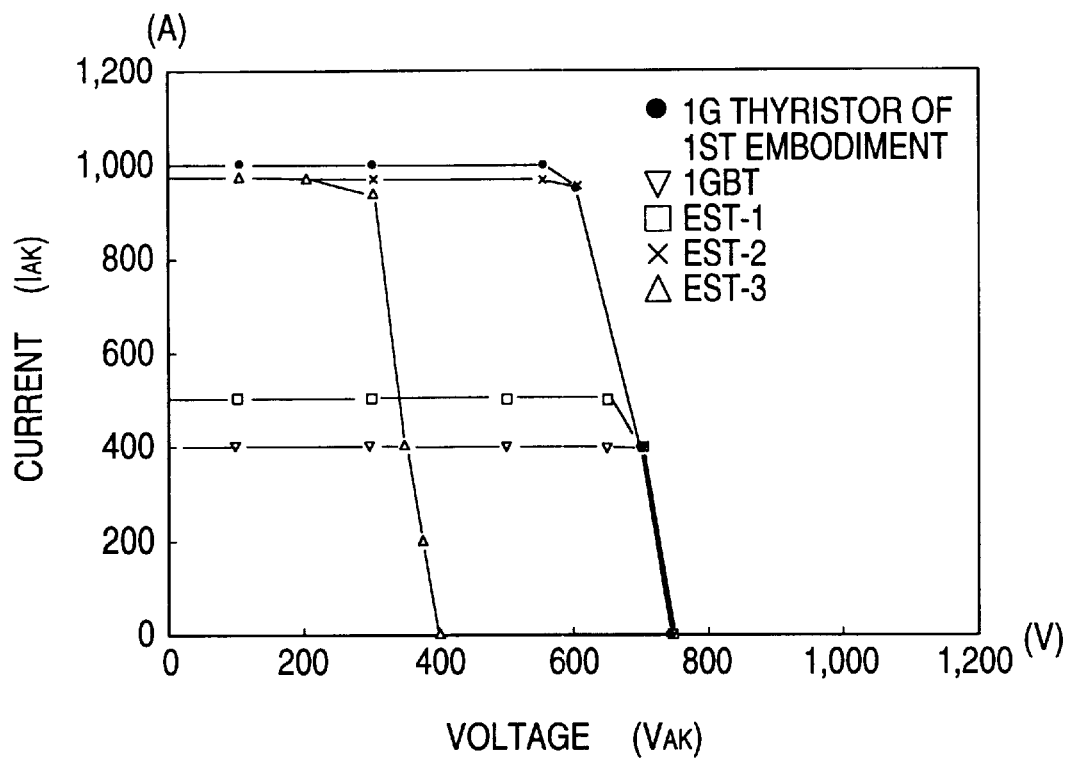
FIG. 3 is an RBSOA chart of 600-V devices of the first embodiment and control examples.
Figure 4:
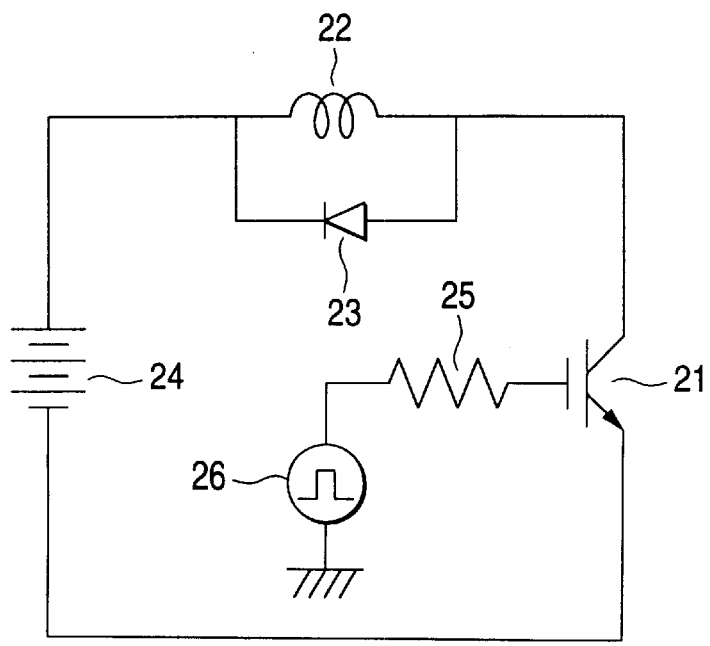
FIG. 4 is an RBSOA measurement circuit diagram.
Figure 12:
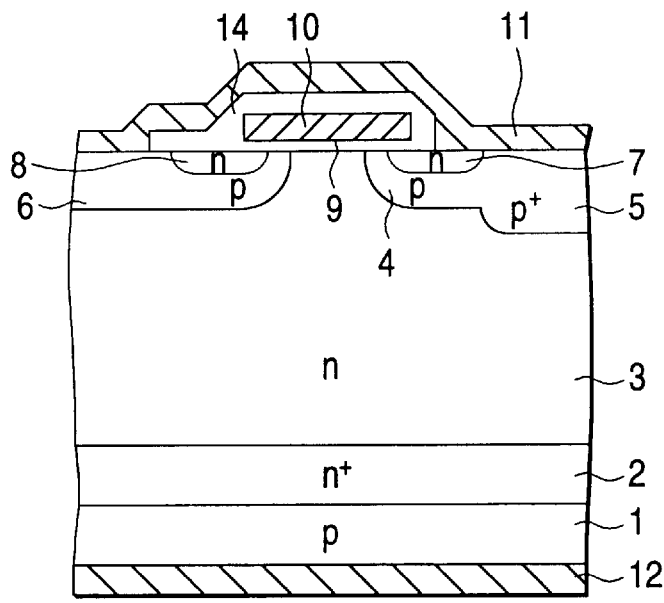
FIG. 12 is a sectional view of an improved EST.
Figure 13:
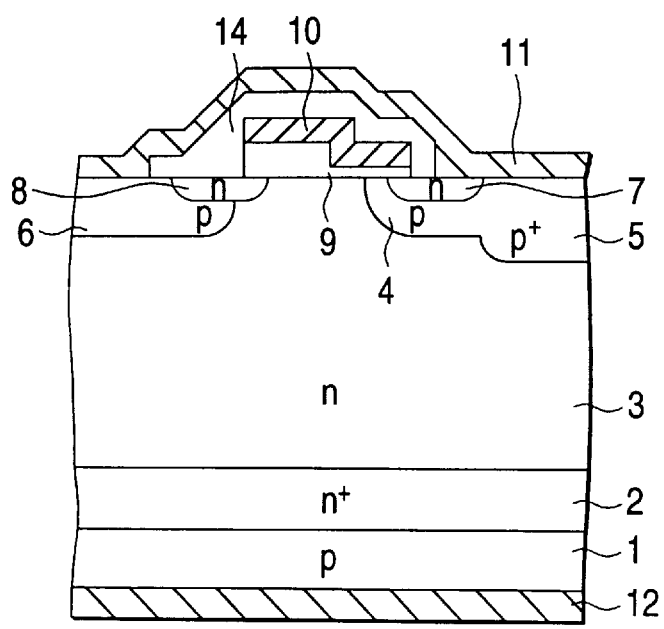
FIG. 13 is a sectional view of another improved EST.

FIG. 3 shows the measurement results of the RBSOAs (reverse bias safe operation areas) of the insulated gate thyristor of the first embodiment shown in FIGS. 1A and 1B and the EST shown in FIG. 11 (EST-1), the EST shown in FIG. 12 (EST-2), the EST shown in FIG. 13 (EST-3), and IGBT as control examples at 125° C. with a measurement circuit shown in FIG. 4. The horizontal axis indicates anode-to-cathode voltages ($V_{AK}$) and the vertical axis indicates currents ($I_{AK}$).

In FIG. 4, a measured device 21 is connected to a DC power supply 24 via an 1-mH inductance 22 and a free wheeling diode 23 connected in parallel, and a gate of the measured device 21 is connected to a gate power supply 26 via a 20 Ω resistor 25.

The measured device shown in FIG. 3 is manufactured as a 600-V class device, and the control example devices are also manufactured using an epitaxial wafer of the same specifications as the insulated gate thyristor of the first embodiment described above. The n emitter regions 8 of the EST-2 and EST-3 are both 20 µm wide. The five devices are of the same chip size 1 cm². The on-state voltage defined as a potential drop at the 100-A conduction time is 0.85 V in the insulated gate thyristor of the first embodiment, 1.6 V in the EST-1, 1.7 V in the EST-2, 1.0 V in the EST-3, and 2.3 V in the IGBT. As seen in FIG. 3, the device of the embodiment of the invention has a wide safe operation area three times that of the IGBT or double that of the EST-1, EST-3, providing a large destruction resistance amount. Moreover, the on-state voltage is low as compared with other devices. The device of the embodiment shows the destruction resistance amount of almost the same degree to that of the EST-2, but the on-state voltage is small and the device of the embodiment has the advantage over the EST-2. That is, the on-state voltage can be lowered without degrading other characteristics because current concentration does not occur since six hexagonal first p base regions 4 and n source regions 7 of surface layers of the base regions 4 are placed surrounding the hexagonal second p base region 6 and the n emitter region 8 of the surface layer of the base region 6 and the opposed portion is long.

Figure 9:
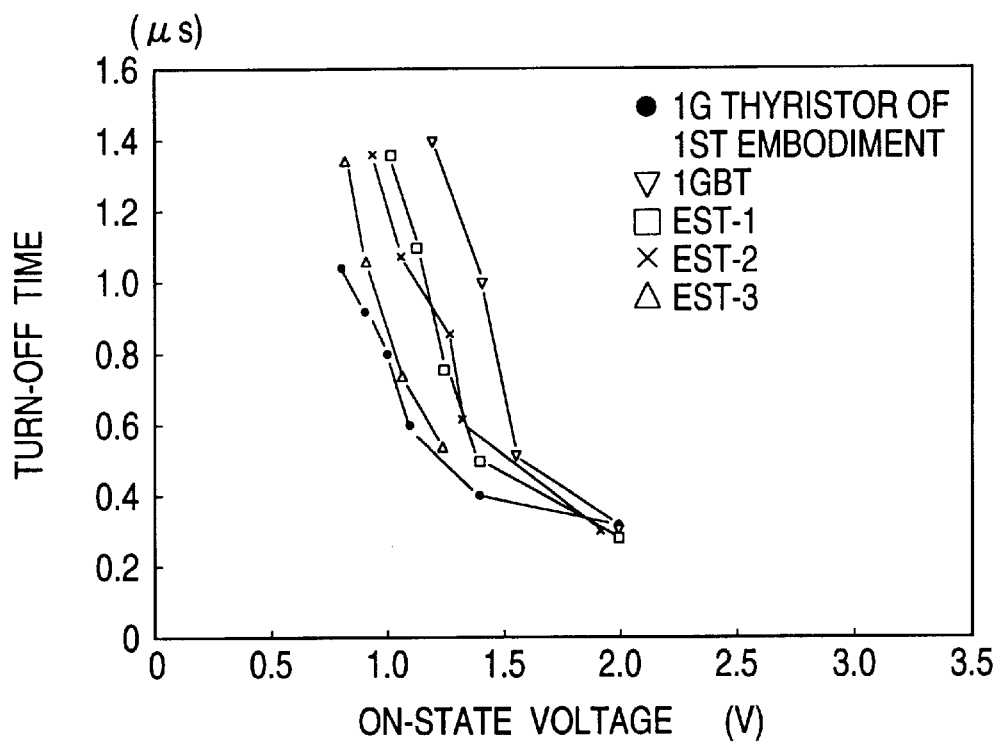
FIG. 9 is a trade-off characteristic chart between the on-state voltage and turn-off time of the 600-V devices of the first embodiments and control examples.

FIG. 9 is a comparison chart of trade-off characteristics between the on-state voltage and turn-off time of the 600-V devices described above, wherein the horizontal axis indicates the on-state voltages and the vertical axis indicates the turn-off time. The on-state voltage is indicated as a potential drop at 25° C. at the current conduction time of 100 A·cm². The turn-off time is measured at 125° C. The graph indicates that the device of the first embodiment shows a good trade-off characteristic as compared with the ESTs or IGBT.

The reason why the device of the first embodiment shows a good trade-off characteristic is that the on-state voltage is low and the switching speed is fast for the reasons as described above. Further, crystal defects resulting in life time killers are localized in the vicinity of the n⁺ buffer layer 2 by irradiation with helium ions from the anode electrode 12 side for optimizing a life time killer distribution. Thus, no time life killers are generated in unnecessary portions and the effect of avoiding an increase in the on-state voltage caused by an unnecessary life time killer is also possible.

In addition, an insulated gate thyristor for which irradiation with helium ions is executed for life time control is also prototyped. The dose amount is at almost the same degree as irradiation with helium ions. The device shows almost the same characteristics as the device of the first embodiment for which irradiation with helium ions is executed.

Embodiment 2

Figure 5A:
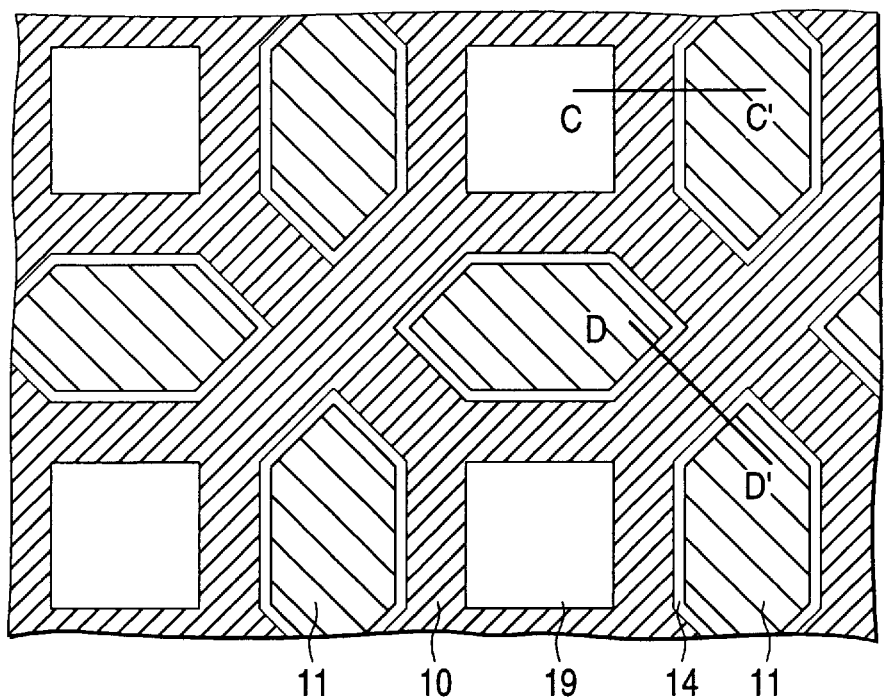
FIG. 5A is a horizontal sectional view at the center of a gate electrode of an insulated gate thyristor of a second embodiment of the invention.
Figure 5B:
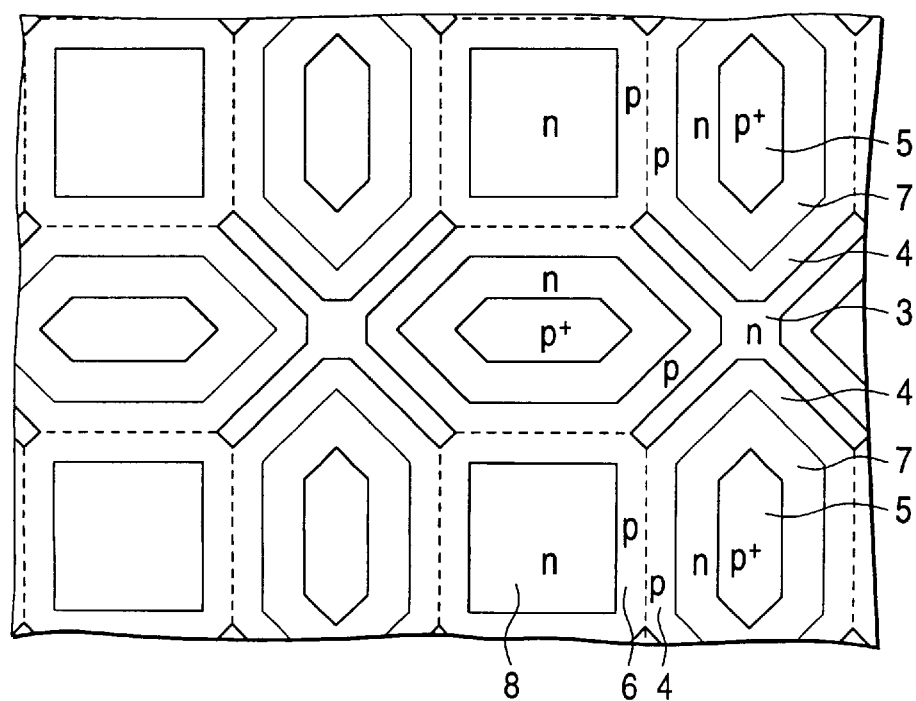
FIG. 5B is a plan view on the silicon substrate surface of the insulated gate thyristor of the second embodiment of the invention.

FIG. 5A is a horizontal sectional view on a plane passing through the center of a gate electrode 10 of an insulated gate thyristor of a second embodiment of the invention. FIG. 5B is a plan view of the silicon substrate surface of the insulated gate thyristor of the second embodiment of the invention.

The insulated gate thyristor has the same configuration as that of the first embodiment; they differ in pattern. That is, four hexagonal cathode electrodes 11 each involving a hexagonal annular insulating film 14 are placed surrounding a square insulating film 19 and a gate electrode 10 bridges the space among them. In FIG. 5B, an n emitter region 8 exists in the portion below the insulating film 19 and is surrounded by a second p base region 6. A hexagonal annular n source region 7 and a p⁺ well region 5 inside the n source region 7 exist in the portion below the cathode electrode 11 and are surrounded by a first p base region 4. The first p base region 4 and the second p base region 6 touch and the boundary therebetween is denoted by a dotted line. An exposure portion of an n base layer 3 appears between the two first p base regions 4. Sectional views taken along lines C–C' and D–D' in FIG. 5A are the same as the sectional views in FIGS. 1A and 1B. The insulated gate thyristor of the second embodiment is manufactured by a similar method to that of the first embodiment in FIGS. 1A and 1B. The first p base region 4, the n source region 7 of a part of the surface layer of the base region 4, the second p base region 6, and the n emitter region 8 of a part of the surface layer of the base region 6 are formed through a hole made in the gate electrode 10. The cathode electrode 11 comes in contact with the surfaces of the first p base region 4 and the n source region 7 through a contact hole made in the insulating film 14 deposited on the side of the gate electrode 10. The surfaces of the second p base region 6 and the n emitter region 8 are covered with the insulating film 19. Also in this case, in fact, the cathode electrode 11 is often extended to the top of the gate electrode 10 via the insulating film 14. Since the first p base region 4 is also formed so as to surround the second p base region 6 in the insulated gate thyristor of the second embodiment, current from the n emitter region 8 of a thyristor section is spread over the first p base region 4 surrounding the n emitter region 8 and current concentration does not occur. Therefore, the insulated gate thyristor of the second embodiment not only has a large destruction resistance amount, but also shows an excellent switching speed and a high withstand voltage.

In the embodiment, four units each having the first p base region are placed surrounding the square second p base region 6. However, of course, other various pattern placements are also possible.

Embodiment 3

Figure 6A:
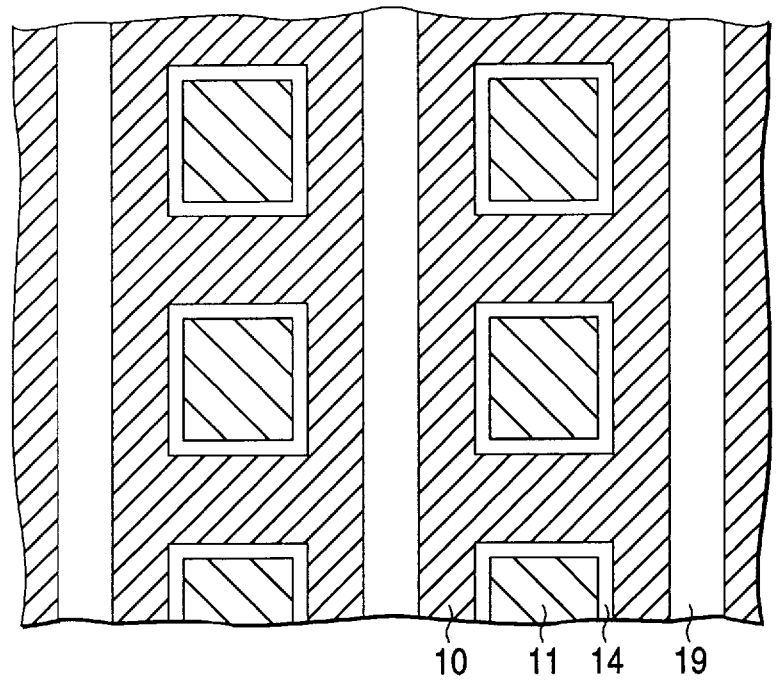
FIG. 6A is a horizontal sectional view at the center of a gate electrode of an insulated gate thyristor of a third embodiment of the invention.
Figure 6B:
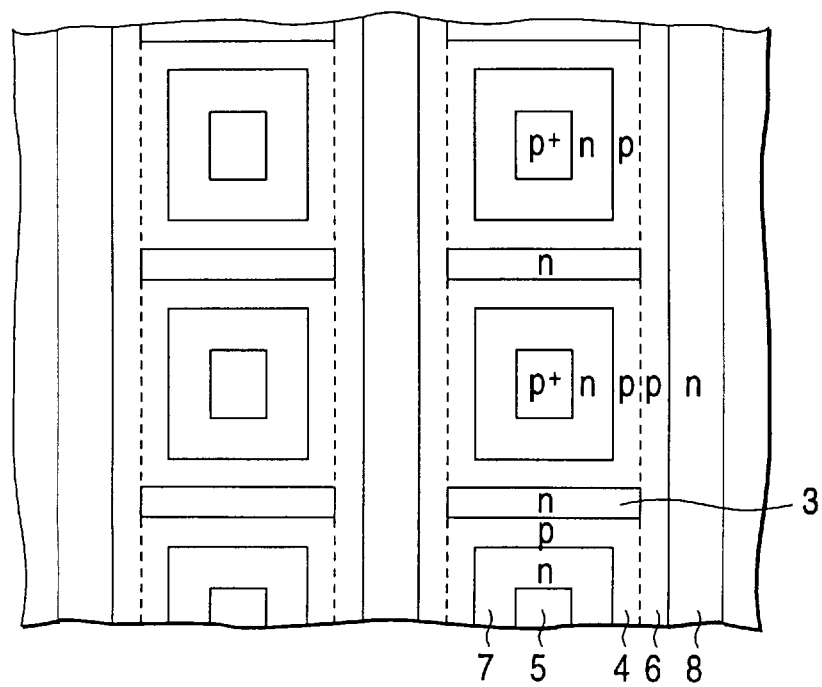
FIG. 6B is a plan view on the silicon substrate surface of the insulated gate thyristor of the third embodiment of the invention.

FIG. 6A is a horizontal sectional view on a plane passing through the center of a gate electrode 10 of an insulated gate thyristor of a third embodiment of the invention. FIG. 6B is a plan view of the silicon substrate surface of the insulated gate thyristor of the third embodiment of the invention. In FIG. 6A, the ladder-like gate electrode 10 is separated by stripe insulating films 19, and a rectangular cathode electrode 11 appears in the gate electrode 10 with an insulating film 14 between. The cathode electrode 11 is rectangular in the sectional view of FIGS. 6A and 6B; in fact, it is often extended to the top of the gate electrode 10 via the insulating film 14.

In FIG. 6B, a second p base region 6 like a stripe and a first p base region 4 which is angular annular touch in the portion below the gate electrode 10 and the boundary therebetween is denoted by a dotted line. An n emitter region 8 like a stripe exists inside the second p base region 6. An angular annular n source region 7 exists inside the first p base region 4 and a p⁺ well region 5 exists inside the n source region 7. A surface exposure portion of an n base layer 3 appears between the two first p base regions 4. The cathode electrode 11 in FIG. 6A comes in contact with the n emitter region 7 and the p+ well region 5, and the insulating film 19 covers the n emitter region 8.

The insulated gate thyristor of the third embodiment not only has a large destruction resistance amount, but also shows an excellent switching speed and a high withstand voltage for similar reasons to those of the second embodiment.

Embodiment 4

Figure 7A:
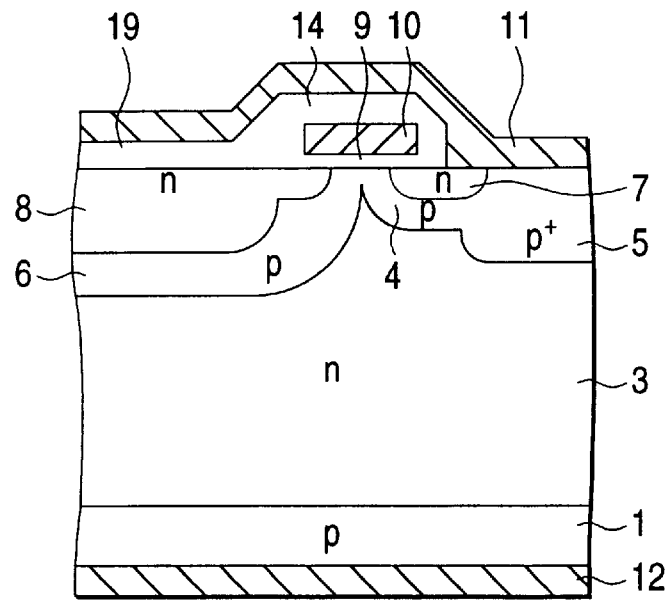
FIGS. 7A and 7B are partially sectional views of an insulated gate thyristor of a fourth embodiment of the invention.
Figure 7B:
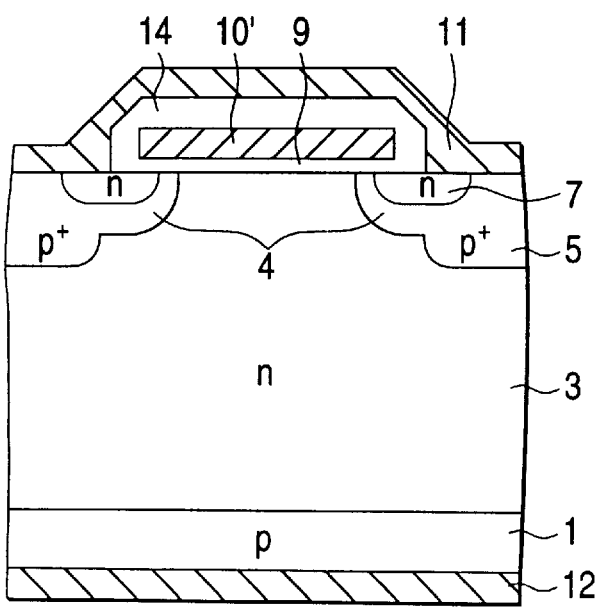

Every device of the first to third embodiments comprises the n+ buffer layer 2 between the p emitter layer 1 and the n base layer 3. However, the invention can also be applied to devices with no n+ buffer layer 2. FIGS. 7A and 7B are partially sectional views of an insulated gate thyristor of a fourth embodiment of the invention manufactured using a bulk silicon wafer rather than an epitaxial wafer. That is, the structure of one main face side of an n base layer 3 made of a bulk silicon wafer is the same as that of the first embodiment, but a p emitter layer 1 is directly formed on the rear face side of the n base layer 3. A polysilicon film 13 is formed on the surface of an n emitter region 8.

Figure 8:
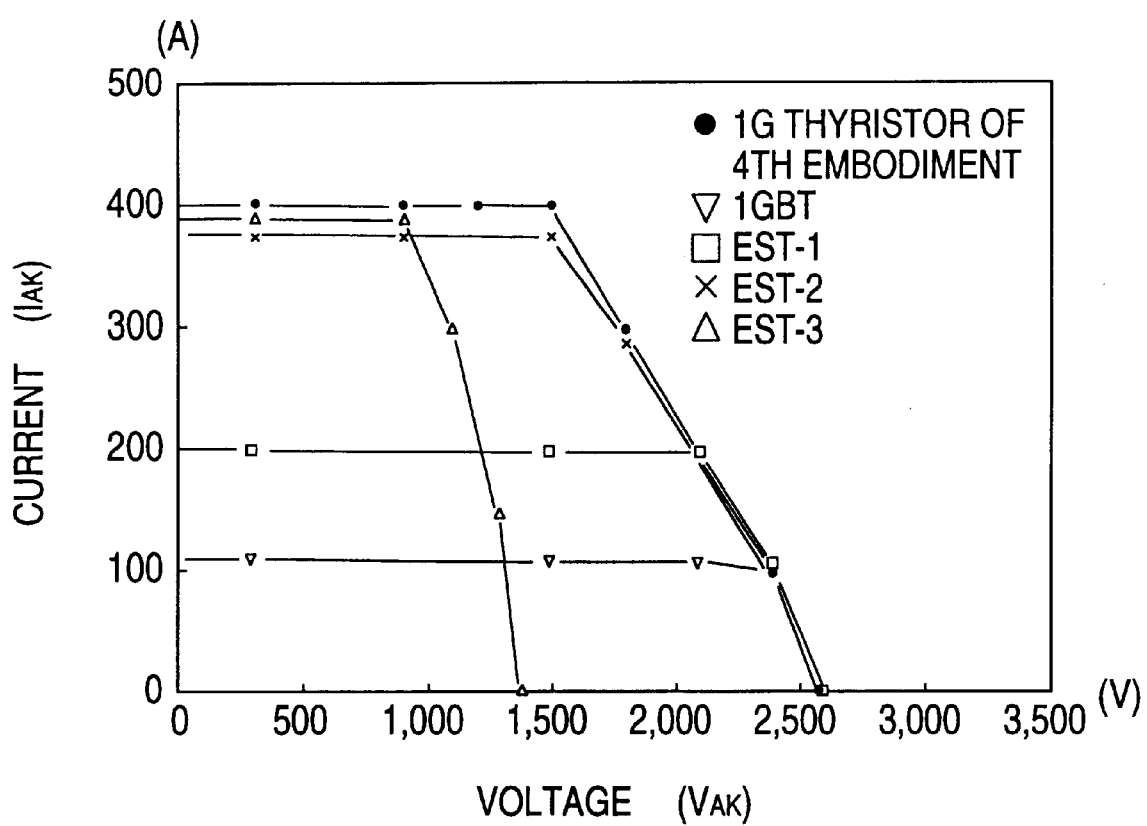
FIG. 8 is an RBSOA chart of 2500-V devices of the fourth embodiment and control examples.

FIG. 8 shows the comparison results of RBSOAs of 2500-V devices of the insulated gate thyristor of the fourth embodiment of the structure in FIGS. 7A and 7B having the pattern in FIGS. 2A and 2B, EST-1, EST-2, EST-3, and IGBT at 125° C. The horizontal axis indicates anode-to-cathode voltages and the vertical axis indicates currents. In this case, the n base layer 3 is 440 μm thick. Other dimensions, etc., are almost the same as those of the insulated gate thyristor of the first embodiment. The on-state voltages of the five devices are 1.05 V, 2.0 V, 2.2 V, 1.4 V, and 3.3 V. Like the 600-V device manufactured using an epitaxial wafer, the insulated gate thyristor of the embodiment of the invention as a 2500-V device manufactured using a bulk wafer also has an exceptionally wide RBSOA and moreover has a low on-state voltage as compared with the ESTs or IGBT because current concentration does not occur since six first p base regions 4 and n source regions 7 of surface layers of the base regions 4 are placed surrounding the second p base region 6 and the n emitter region 8 of the surface layer of the base region 6 and the opposed portion is long.

That is, the invention has the effect of being capable of widening the RBSOA without degrading the on-state voltage independently of the resistivity of the n base layer 3 or the current amplification factor of pnp wide base transistor. In other words, the invention is effective for decreasing the on-state voltage and improving the RBSOA independently of the rated voltage of the device or the semiconductor crystal manufacturing method of the substrate.

Figure 10:
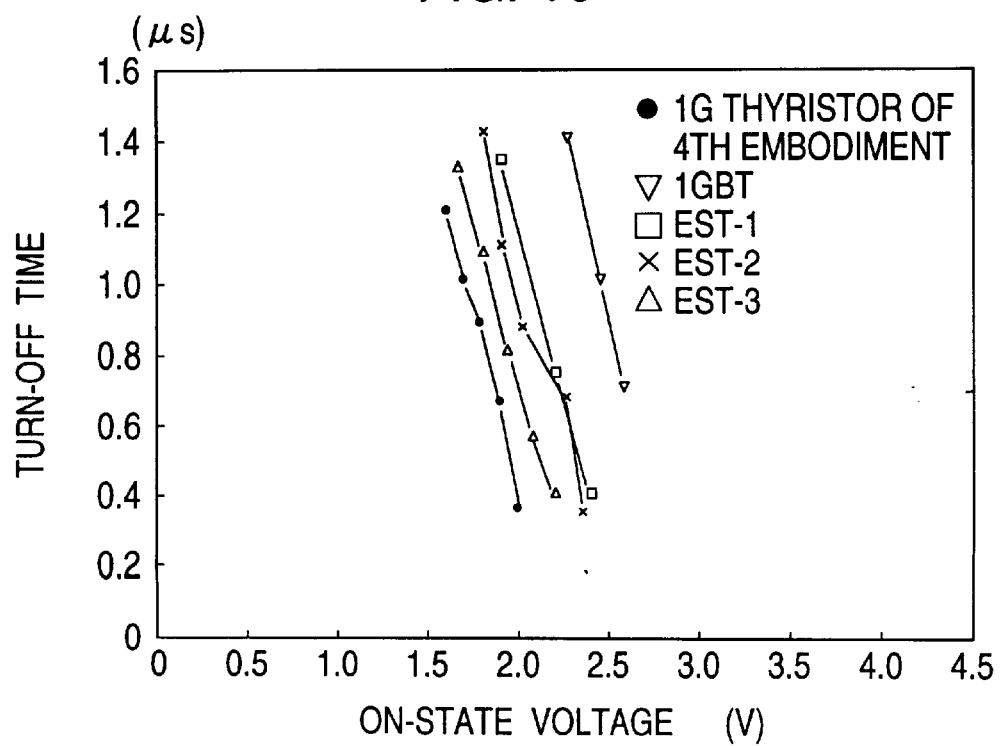
FIG. 10 is a trade-off characteristic chart between the on-state voltage and turn-off time of the 600-V devices of the fourth embodiments and control examples.

FIG. 10 is a comparison chart of trade-off characteristics between the on-state voltage and turn-off time of the 2500-V devices described above, wherein the horizontal axis indicates the on-state voltages and the vertical axis indicates the turn-off time. The on-state voltage is indicated as a potential drop at 25° C. at the current conduction time of 50 A·cm$^{-2}$. The turn-off time is measured at 125° C. The graph indicates that the device of the fourth embodiment with the structure in FIGS. 7A and 7B having the pattern in FIGS. 2A and 2B shows a good trade-off characteristic as compared with the ESTs or IGBT.

Irradiation with helium ions is executed for life time control of the insulated gate thyristor of the fourth embodiment; a device is also prototyped for which irradiation with protons is executed. The device has almost the same reverse bias safe operation area (RBSOA) and the trade-off characteristic between the on-state voltage and turn-off time as the fourth embodiment wherein irradiation with helium ions is executed. Localized life time killers can also be generated by irradiation with protons.

The 2500-V devices of other patterns as shown in FIGS. 5A, 5B and 6A, 6B also show a good trade-off characteristic as compared with the ESTs or IGBT.

As we have discussed, according to the invention, although a potential drop to place the thyristor in a latch-up state from the IGBT mode is obtained by current flowing in the Z direction in the EST, the surface of the second second conduction type base region is covered with an insulating film and a potential rise caused by hole current in the second conduction type base region is used, whereby the transition to the thyristor mode and recovery of the pn junction at the turn-off time become uniform and controllable current increases. A portion where the first and second second conduction type base regions are brought into contact with each other is provided and the channel region at the on time is shortened and is provided with a portion not touching the first conduction type base layer, whereby the on-state voltage is decreased.

Resultantly, there are provided voltage-driven insulated gate thyristors each having a better trade-off characteristic between the on-state voltage and turn-off time and a wider reverse bias safe operation area than the ESTs or IGBT in a wide withstand voltage range of 600 V to 2500 V.

These devices contribute greatly to a decrease in switching losses of not only single devices, but also power converters using the devices.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An insulated gate thyristor, comprising:
   a first conductivity type base layer of high resistivity;
   a first second-conductivity type base region and a second second-conductivity type base region, selectively formed in a surface layer of one face of said first conductivity type base layer;
   a first conductivity type source region selectively formed in a surface layer of said first second-conductivity type base region;
   a first conductivity type emitter region selectively formed in a surface layer of said second second-conductivity type base region;
   a gate electrode formed via an insulating film on a surface of said first second-conductivity type base region sandwiched between said first conductivity type source region and said emitter region, an exposed portion of said first conductivity type base layer, and a surface of said second second-conductivity type base region;
   a first main electrode in contact with an exposed portion of said first second-conductivity type base region and said first conductivity type source region;

a second-conductivity type emitter layer formed on an opposite face of said first conductivity type base layer;

a second main electrode in contact with said second-conductivity type emitter layer; and an insulating film covering a surface of said second second-conductivity type base region;

wherein said first second-conductivity type base region and said second second-conductivity type base region are connected below said gate electrode.

2. The insulated gate thyristor as claimed in claim 1 wherein said second second-conductivity type base region forms a rectangular strip.

3. The insulated gate thyristor as claimed in claim 1 wherein at least one of said first second-conductivity type base region, said second second-conductivity type base region, said first conductivity type emitter region, and said first conductivity type source region forms a polygonal shape, a circular shape, or an elliptical shape.

4. The insulated gate thyristor as claimed in claim 3 wherein said first second-conductivity type base region and said first conductivity type source region are formed so as to surround said second second-conductivity type base region.

5. The insulated gate thyristor as claimed in claim 3 wherein a plurality of said first second-conductivity type base regions are formed in proximity to said second second-conductivity type base region.

6. The insulated gate thyristor as claimed in claim 5 wherein a plurality of said first second-conductivity type base regions and a plurality of said first conductivity type source regions are formed in proximity to said second second-conductivity type base region; and wherein a substantially annular gate electrode is disposed so as to surround the insulating film on the surface of said second second-conductivity type base region;

wherein said fist main electrode is disposed via an insulating film on an opposite side of said gate electrode.

7. The insulated gate thyristor as claimed in claim 6 wherein said first conductivity type base layer exists between two first second-conductivity type base regions and wherein said gate electrode is disposed via a gate insulating film on the surfaces of the two first second-conductivity type base regions.

8. The insulated gate thyristor as claimed in claimed 7 wherein a contact portion between said first main electrode, said first second-conductivity type base region and said first conductivity type source region forms a polygon, a circle, or an ellipse.

9. An insulated gate thyristor, comprising:

a first conductivity type base layer of high resistivity;

a first second-conductivity type base region and a second second-conductivity type base region, selectively formed in a surface layer of one face of said first conductivity type base layer; and a gate electrode formed via an insulating film on a surface of said first second-conductivity type base region, an exposed portion of said first conductivity type base layer, and a surface of said second second-conductivity type base region;

wherein said first second-conductivity type base region is in contact with said second second-conductivity type base region below said gate electrode.

10. An insulated gate thyristor, comprising:

a first conductivity type base layer of high resistivity;

a first second-conductivity type base region and a second second-conductivity type base region, selectively formed in a surface layer of one face of said first conductivity type base layer;

a first conductivity type source region selectively formed in a surface layer of said first second-conductivity type base region;

a first conductivity type emitter region selectively formed in a surface layer of said second second-conductivity type base region;

a gate electrode formed via an insulating film on a surface of said first second-conductivity type base region sandwiched between said first conductivity type source region and emitter region, an exposed portion of said first conductivity type base layer, and a surface of said second second-conductivity type base region;

a first main electrode in contact with an exposed portion of said first second-conductivity type base region and said first conductivity type source region;

a second conductivity type emitter layer formed on an opposite face of said first conductivity type base layer;

a second main electrode in contact with said second conductivity type emitter layer; and an insulating film covering a surface of said second second-conductivity type base region;

wherein said first second-conductivity type base region and said second second-conductivity type base region are connected below said gate electrode;

wherein at least one of said first second-conductivity type base region, said second second-conductivity type base region, said first conductivity type emitter region, and said first conductivity type source region forms a polygonal shape, a circular shape, or an elliptical shape;

wherein a plurality of said first second-conductivity type base regions and a plurality of said first conductivity type source regions are formed in proximity to said second second-conductivity type base region;

wherein a substantially annular gate electrode is disposed so as to surround the insulating film on the surface of said second second-conductivity type base region;

wherein said first main electrode is disposed via an insulating film on an opposite side of said gate electrode;

wherein said first conductivity type base layer exists between two first second-conductivity type base regions and wherein said gate electrode is disposed via a gate insulating film on the surfaces of the two first second-conductivity type base regions.

* * * * *

UNITED STATES PATENT AND TRADEMARK OFFICE
CERTIFICATE OF CORRECTION

PATENT NO.: 5,936,267
DATED: August 10, 1999
INVENTOR: Noriyuki IWAMURO

It is certified that an error appears in the above-identified patent and that said Letters Patent is hereby corrected as shown below:

Claim 6, Column 13, line 36, "fist" should read --first--.

Claim 8, Column 13, line 44, "claimed 7" should read --claim 7--.

Signed and Sealed this

Tenth Day of October, 2000

Q. TODD DICKINSON

*Attest:*

*Attesting Officer*  *Director of Patents and Trademarks*